United States Patent
Smalley et al.

(10) Patent No.: US 10,141,241 B2
(45) Date of Patent: Nov. 27, 2018

(54) MULTI-CHIP SELF ADJUSTING COOLING SOLUTION

(71) Applicant: INTEL CORPORATION, Santa Clara, CA (US)

(72) Inventors: Jeffory L. Smalley, East Olympia, WA (US); Susan F. Smith, Olympia, WA (US); Mani Prakash, University Place, WA (US); Tao Liu, Dupont, WA (US); Henry C. Bosak, Hillsboro, OR (US); Harvey R. Kofstad, Vernonia, OR (US); Almanzo T. Ortiz, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/767,843

(22) PCT Filed: Sep. 27, 2014

(86) PCT No.: PCT/US2014/057922
§ 371 (c)(1),
(2) Date: Aug. 13, 2015

(87) PCT Pub. No.: WO2016/048384
PCT Pub. Date: Mar. 31, 2016

(65) Prior Publication Data
US 2016/0276243 A1   Sep. 22, 2016

(51) Int. Cl.
*H01L 23/367*   (2006.01)
*H01L 23/40*   (2006.01)
(Continued)

(52) U.S. Cl.
CPC ...... *H01L 23/3677* (2013.01); *H01L 23/3675* (2013.01); *H01L 23/4093* (2013.01);
(Continued)

(58) Field of Classification Search
None
See application file for complete search history.

(56) References Cited

U.S. PATENT DOCUMENTS 5,808,236 A * 9/1998 Brezina ............... H01L 23/4093
                                                165/80.3
5,862,038 A * 1/1999 Suzuki ................ H01L 23/4006
                                                165/80.2
(Continued)

FOREIGN PATENT DOCUMENTS

CN      101305460       11/2008
JP      04-263457        9/1992
(Continued)

OTHER PUBLICATIONS

PCT Search Report and Written Opinion for Int. application No. PCT/US2014/057922 dated Jun. 26, 2015.
(Continued)

*Primary Examiner* — Andres Munoz
(74) *Attorney, Agent, or Firm* — Schwabe, Williamson & Wyatt, P.C.

(57) ABSTRACT

An apparatus including a primary device and at least one secondary device coupled in a planar array to a substrate; a first passive heat exchanger disposed on the primary device and having an opening over an area corresponding to the at least one secondary device; a second passive heat exchanger disposed on the at least one secondary device; at least one first spring operable to apply a force to the first heat exchanger in a direction of the primary device; and at least one second spring operable to apply a force to the second heat exchanger in the direction of the secondary device. A method including placing a passive heat exchanger on a multi-chip package, and deflecting a spring to apply a force in a direction of an at least one secondary device on the package.

8 Claims, 6 Drawing Sheets

(51) Int. Cl.
*H01L 23/433* (2006.01)
*H01L 25/065* (2006.01)

(52) U.S. Cl.
CPC ...... *H01L 23/4338* (2013.01); *H01L 25/0655* (2013.01); *H01L 2924/0002* (2013.01)

(56) References Cited

U.S. PATENT DOCUMENTS

| | | | |
|---|---|---|---|
| 7,113,406 B1* | 9/2006 | Nguyen | H01L 23/4006 165/185 |
| 7,495,922 B2* | 2/2009 | Ploeg | H01L 23/40 257/718 |
| 2006/0176666 A1* | 8/2006 | Saturley | G06F 1/20 361/679.46 |
| 2008/0266808 A1 | 10/2008 | Aberg et al. | |
| 2009/0085187 A1* | 4/2009 | Scott | H01L 23/42 257/690 |
| 2009/0321901 A1 | 12/2009 | Lopez et al. | |
| 2011/0088874 A1 | 4/2011 | Meyer, IV et al. | |
| 2012/0162922 A1 | 6/2012 | Cheyne et al. | |
| 2013/0258599 A1 | 10/2013 | Danello et al. | |
| 2014/0002989 A1 | 1/2014 | Ahuja et al. | |
| 2014/0239482 A1 | 8/2014 | Kourakata et al. | |
| 2016/0118315 A1* | 4/2016 | Smith | H01L 23/3672 257/713 |
| 2016/0284624 A1 | 9/2016 | Yamada | |

FOREIGN PATENT DOCUMENTS

| | | |
|---|---|---|
| JP | H10 70383 A | 3/1998 |
| JP | 3139706 | 2/2008 |
| JP | 2014-138018 | 7/2014 |
| RU | 134358 | 10/2013 |
| WO | WO 2014148026 | 9/2014 |

OTHER PUBLICATIONS

Intel Corporation, "International Preliminary Report on Patentability and Written Opinion", PCT Application No. PCT/US2014/057922, (dated Mar. 28, 2017).
Intel Corporation, "Non-Final Office Action", U.S. Appl. No. 14/918,119, (dated Jan. 30, 2017).
Intel Corporation, "Office Action with search report", TW Application No. 104127518, (dated May 22, 2017).
Search Report for European Patent Application No. 14902341.8 dated May 7, 2018, 9 pages.
Office Action for Russian Patent Application No. 2017105797, dated Feb. 22, 2018, 13 pages.
Office Action for Japanese Patent Application No. 2017-511160, dated Apr. 3, 2018, 6 pages.
Office Action for Chinese Patent Application No. 201480081475.6, dated Jul. 26, 2018, 7 pages, no translation.
Notice of Allowance for Japanese Patent Application No. 2017-511160 dated Oct. 9, 2018, 1 page.

* cited by examiner

MULTI-CHIP SELF ADJUSTING COOLING SOLUTION

CROSS-REFERENCE TO RELATED APPLICATION

This patent application is a U.S. National Phase Application under 35 U.S.C. § 371 of International Application No. PCT/US2014/057922, filed Sep. 27, 2014, entitled MULTI-CHIP SELF ADJUSTING COOLING SOLUTION.

BACKGROUND

Field

Multi-chip product cooling.

Description of Related Art

Many integrated circuit products incorporate multi-chip products. An example of a multi-chip product is a package including a microprocessor and memory and companion devices or components (e.g., chips). Packaging can consist of a single integrated heat spreader (IHS) over all the components or individual IHS for each component. Each packaging option has advantages and disadvantages but still each component requires adequate cooling.

The different package options significantly impact the overall junction to ambient thermal resistance. A bond line thickness (BLT) of each of a thermal interface material between the die and IHS (TIM1) and thermal interface material between the IHS and heatsink (TIM2) are two of the most significant thermal resistance factors along with die/IHS size, power density, and total power.

A single IHS design provides one relatively flat surface to interface with a cooling solution such as a passive heat exchanger (e.g., a heatsink) but a single IHS package option can have significant implications on the TIM1 BLT and thus the package thermal resistance (die to IHS). The tolerance between each component must be accounted for either at the package level internal to the IHS as in the single IHS option or at the cooling solution level with the individual IHS option. The tolerance results in a wide range of thickness for the TIM1 BLT of certain chips in a multi-chip product employing the single IHS option. As companion components decrease in size and increase in power density, the thermal resistance from the TIM1 BLT can significantly impact the package performance.

The individual IHS package option minimizes the TIM1 BLT on each component and thus also a package thermal resistance. One drawback is that there are now multiple non-coplanar surfaces that must interface to the cooling solution. The cooling solution (passive heat exchanger) is typically justified to the CPU IHS thus minimizing its TIM2 BLT and corresponding thermal resistance. But the cooling must now account for the variation and non-planarity of each individual component IHS often resulting in a large TIM2 BLT range on each component.

DETAILED DESCRIPTION

A cooling solution and method of implementing a cooling solution to improve a cooling capability and performance of each component of a multi-chip product package (or multiple packages) on a motherboard that require cooling. The cooling solution adjusts to varying height components or packaging and thus obtains and is operable to maintain a minimum thermal interface resistance for each component. In this manner, the cooling solution can utilize existing thermal interface materials, minimize bond line thickness and its implementation does not thermally sacrifice one component for the sake of another.

Figure 1:
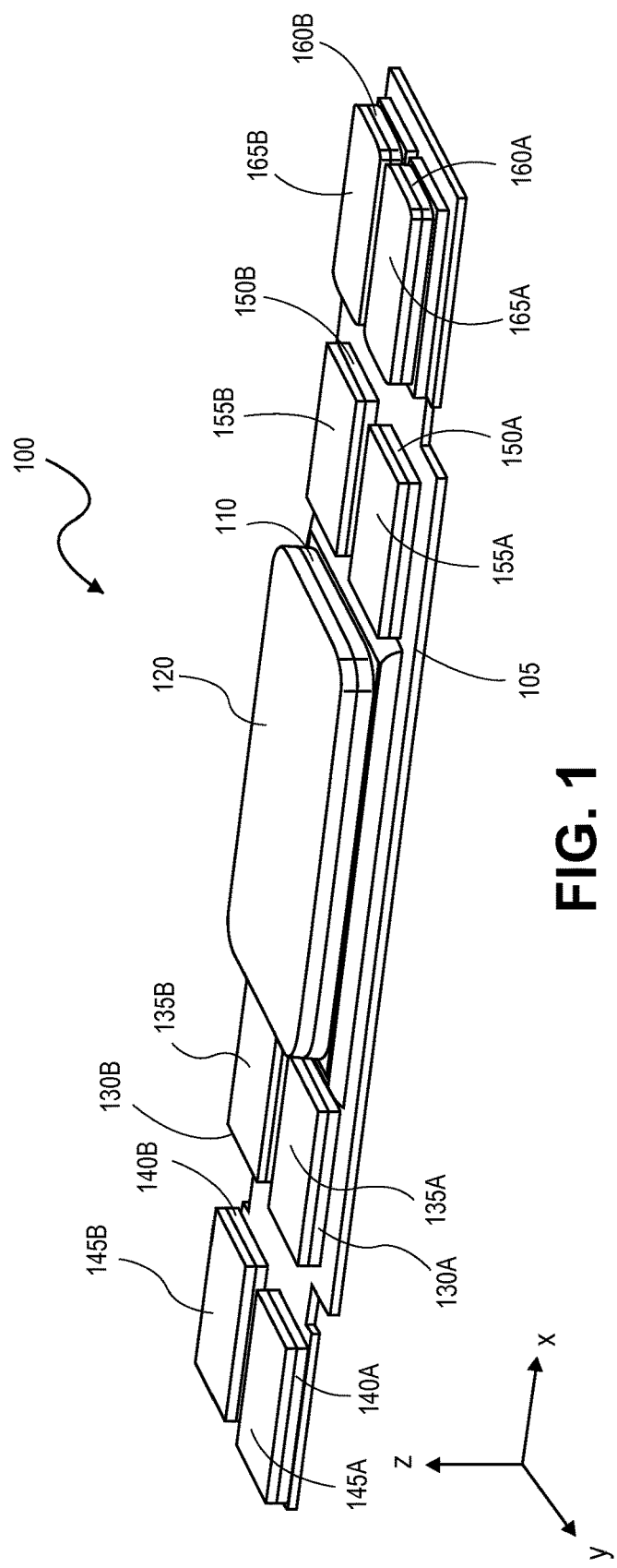
FIG. 1 shows a top side perspective view of a generic multi-chip package including central processing unit (CPU).

FIG. 1 shows a top side perspective view of a generic multi-chip central processing unit (CPU) package. Package 100 includes die 110 disposed on processor substrate 105. Overlying die 110 is IHS 120 with a TIM1 material therebetween. In one embodiment, package 100 also includes secondary devices of, for example, memory chip 130A, memory chip 130B, memory chip 140A, memory chip 140B, memory chip 150A and memory chip 150B, as well as companion chip 160A and companion chip 160B that are, for example, each a processor. It is appreciated that the secondary devices as memory chips and companion chips are one example. In another embodiment, other types of devices can be present in the package. Each of the primary device (die 110) and the second devices (memory chips 130A/B, 140A/B, 150A/B, and companion chips 160A/B) are connected in a planar array to substrate 105. In one embodiment, a thickness (z-dimension) of one or more of the secondary devices is different than a thickness (z-dimension) of die 110. In one embodiment, one or more of the secondary devices has a z-dimension thickness that is less than a thickness of die 110. In another embodiment, a z-direction thickness of one or more secondary devices is different from die 110 and one or more other secondary devices.

In one embodiment, overlying each secondary device is an IHS with a TIM1 therebetween. FIG. 1 shows IHS 135A on memory chip 130A, IHS 135B on memory chip 130B, IHS 145A on memory chip 140A, IHS 145B on memory chip 140B, IHS 155A on memory chip 150A and IHS 155B on memory chip 150B. Overlying companion chip 160A is IHS 165A and overlying companion chip 160B is IHS 165B each with a TIM1 therebetween. In one embodiment, TIM1 is consistently thin or effectively minimal between each IHS and its respective primary device (e.g., die 110) or secondary device (e.g., memory chip 130A-150A, companion chip 160A-B) to improve the thermal performance between each heat generating component and a cooling solution and thus minimize the temperature of each component. In one embodiment, a suitable TIM1 is a polymer TIM with a representative thickness on the order of 20 microns (μm) to 30 μm.

Figure 2:
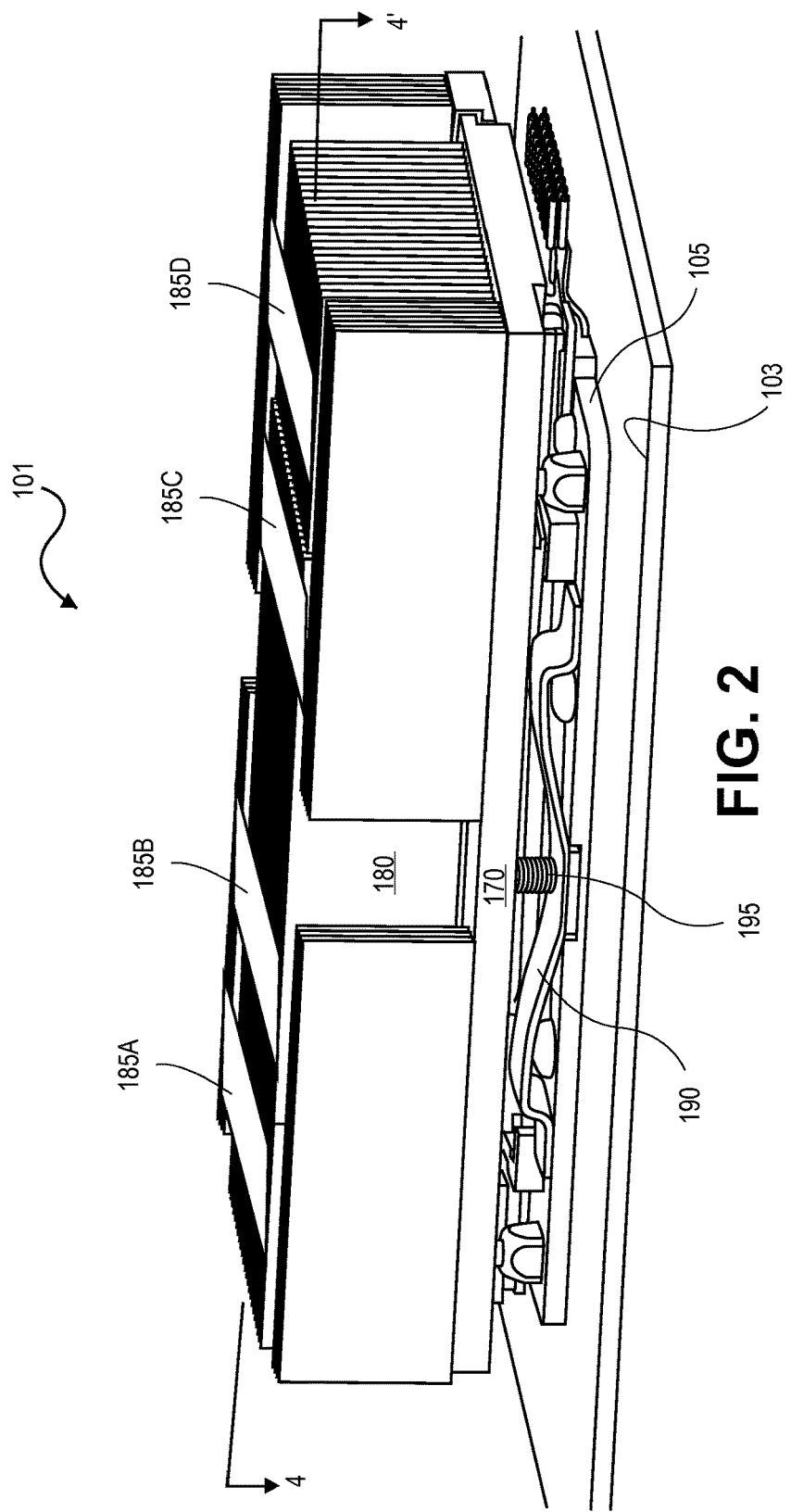
FIG. 2 shows the structure of FIG. 1 following the introduction of a cooling solution on the multi-chip package.

FIG. 2 shows the structure of FIG. 1 following the introduction of a cooling solution on multi-chip package 100. Assembly 101 includes a cooling solution that, in this embodiment, is a passive heat exchanger that is a heatsink including a first portion including heatsink base 170 and fins 180. The first portion of the heatsink includes an area dimension that, in one embodiment, is disposed over an area portion of multi-chip package 100 or an area of multi-chip package 100 including heat generating devices (e.g., an area including the primary device and secondary devices). FIG. 2 shows a first portion of the heat exchanger (heatsink) over/on CPU die 110 and IHS 120 with heatsink base 170 justified to IHS 120. Heatsink base 170 is justified to IHS 120 in the sense that it is in physical contact with the IHS or in contact with a TIM2 material disposed on a surface of IHS 120 to a minimum effective thickness for such material.

The first portion of the heat exchanger (heatsink) including heatsink base 170 and fins 180 also includes a number of openings over areas corresponding to the secondary devices of multi-chip package 100, notably memory dies 130A, 130B, 140A, 140B, 150A and 150B and companion dies 160A and 160B. Disposed within such openings are second heat exchanger (heatsink) portions each including a base and fin structure. FIG. 2 shows second heatsink fin 185A (disposed over memory die 140A and memory die 140B; fin 185B disposed over memory die 130A and memory die 130B; heatsink fin 185C disposed over memory die 150A and memory die 150B; and heatsink fin 185D disposed over companion die 160A and companion die 160B). FIG. 2 also shows a primary connection of the heatsink to package 100. Notably, FIG. 2 shows mechanical loading spring 190 that is deflected (e.g., compressed) by screw 195 that is accessible at a surface of heatsink base 170.

Figure 3:
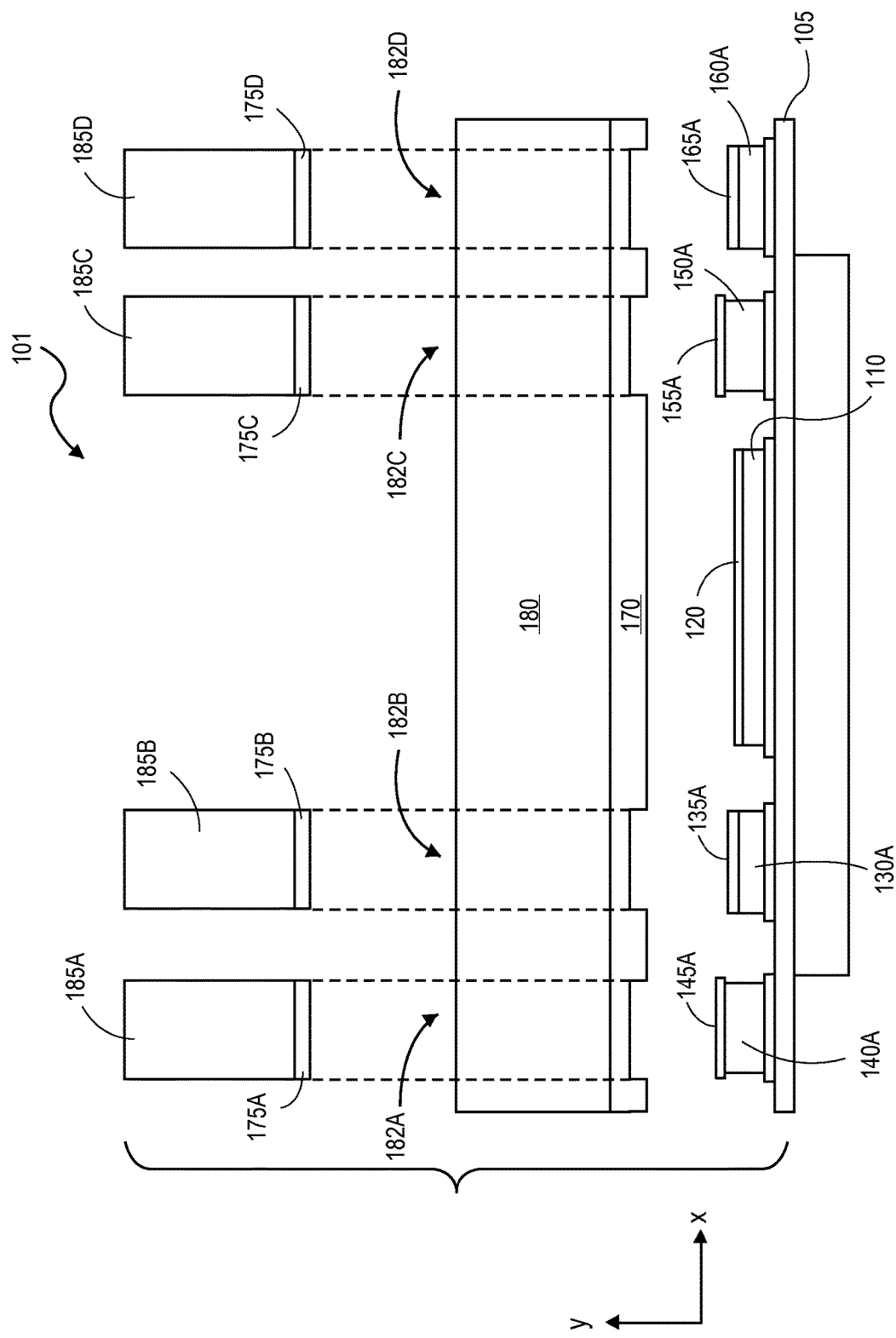
FIG. 3 shows a schematic exploded side view of the assembly of FIG. 2.

FIG. 3 shows a schematic exploded view of the assembly of FIG. 2. Notably, FIG. 3 shows a cooling solution of a passive heat exchanger that is a heatsink including a first portion including heatsink base 170 and heatsink fin 180. The first portion of the heatsink also has a number of openings disposed through heatsink base 170 and heatsink fins 180 (extending therethrough) and aligned with or corresponding to an area including memory die 130A/B (opening 182B), memory die 140A/B (opening 182A) and memory die 150A/B (opening 182C) and companion chip 160A/B (opening 182D), respectively. FIG. 3 shows second portions of the passive heat exchanger (heatsink) having dimensions to be positioned within openings 182A-D and having a respective xy area corresponding to an area of respective secondary devices. Referring to FIG. 3, the second portions of the passive heat exchanger (heatsink) include heatsink base 175A/heatsink fin 185A corresponding to an xy area over memory die 140A/B; heatsink base 175B/fin 185B corresponding to an xy area over memory die 130A/B; heatsink base 175C/fin 185C over an xy area corresponding to memory die 150A/B; and heatsink base 175D/fin 185D over an xy area corresponding to companion chip 160A/B.

Figure 4:
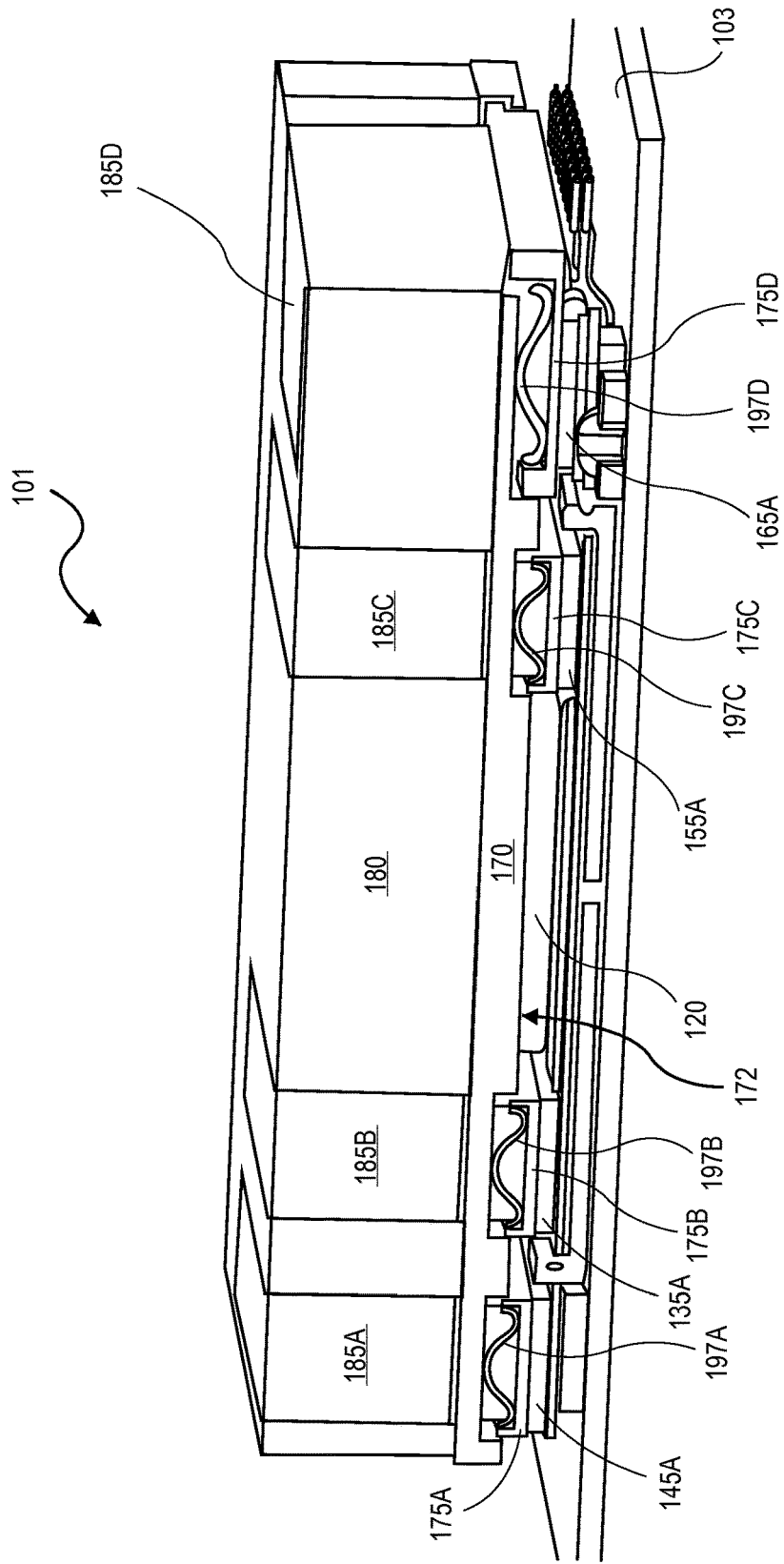
FIG. 4 shows a cross-sectional side view through line 4-4' of FIG. 2.

FIG. 4 shows a cross-sectional side view through line 4-4' of FIG. 2. FIG. 4 shows assembly 101 including passive heat exchanger (heatsink) having a first portion including heatsink base 170 and heatsink fin 180 on heatsink base 170. Heatsink base 170 of the first portion of the heatsink is justified to IHS 120 on the primary die of the multi-chip package, in this case on CPU 110 as the primary heat generating device on the package. A minimum effective TIM2 thickness separates heatsink base 170 from IHS 120. A representative TIM2 material for the primary and secondary devices is a phase change material.

FIG. 4 shows heatsink base 170 associated with the first portion of the passive heat exchanger isolated from secondary heat transfer surfaces over areas corresponding to the secondary devices of the multi-chip package. Heatsink base 170 is separated by openings formed through the heatsink base in areas corresponding to positions of the secondary devices on the multi-chip package. FIG. 4 also shows the second portions of the heatsink disposed in openings through the first portion, the second portions including heatsink base 175A on IHS 145A; heatsink 175B on IHS 135A; heatsink base 175C on IHS 155A; and heatsink base 175D on IHS 165A, respectively. In one embodiment, one or more of the second portion heatsink bases has a z-dimension thickness that is different than a z-dimension thickness of heatsink base 170. In one embodiment, one or more of the second portion heatsink bases has a z-dimension thickness that is less than a z-dimension thickness of heatsink base 170. Each heatsink base is separated from a respective IHS on a secondary device (memory chip, companion chip) by a minimum effective layer thickness of TIM2. Disposed on each second portion heatsink base is a fin portion (fins 185A, 185B, 185C and 185D, respectively). FIG. 4 further shows second heatsink fins 185A-185D that, in one embodiment, are each isolated from one another and disposed in opening in heatsink fin first portion 180. In one embodiment, the second portions of the heatsink are supported in the openings in the first portion of the passive heat exchanger through embedded springs (e.g., embedded wave springs) and otherwise float in the respective openings (e.g., a second portion heatsink is not impeded from moving by the walls of the first portion heatsink fin or base).

FIG. 4 shows each second heatsink base (heatsink bases 175A-175B) is spring-loaded using an embedded spring between heatsink base 170 and the respective second heatsink base (heatsink bases 175A-D). FIG. 4 shows wave spring 197A, wave spring 197B, wave spring 197C and wave spring 197D in contact at each end with the respective second heatsink base (heatsink bases 175A-175D) and a mid portion in contact with heatsink base 170. Prior to deflection of a spring (springs 197A-D), in one embodiment, each second heatsink base extends beyond a plane of a surface of heatsink base 170 (extends a distance beyond surface 172 of heatsink base 170 that is justified to the primary device (IHS 120 on CPU 110). As the passive heat exchanger (heatsink) is assembled on multi-chip package 100, heatsink base 170 is justified to IHS 120 and the individual springs 197A-D are deflected and each second heatsink bases 175A-D may be displaced in a direction away from multi-chip package 100 (i.e., a direction toward surface 172 of heatsink base 170). Deflection of mechanical loading solution spring 190 (see FIG. 2) aids in a deflection of springs 197A-197D. In one embodiment, a predetermined amount of force (e.g., 200 pound force (890 newtons) to 250 pound force (1112 newtons) is transferred through heatsink base 170 into IHS 120.

Second heatsink bases 175A-D generate independent loading of each of the secondary devices (memory chips 130A/B, 140A/B and 150A/B and companion chips 160A/B) through deflection (e.g., compression) of the spring associated with the individual heatsink portions (e.g., a wave or coil spring) as the second heatsink base makes contact with a device or its IHS. In one embodiment, springs 197A-D are selected such that a desired deflection provides a predetermined total force to maintain a mechanical load of the heatsink portions on the individual secondary devices and on the package. FIG. 4 shows an embodiment of a passive heat exchanger that includes springs for secondary heat generating devices are internal to the heat exchanger (internal to the heatsink assembly). The configuration of spring-loaded second heatsink bases with a spring loading between the second heatsink base and heatsink base 170 allows each independent second heatsink base to align in any combination of front to back or side to side to justify each heatsink base surface to the component surface being cooled. In this way, a TIM bond line (TIM2 BLT) on each component may be minimized and consistently maintained throughout reliability testing thus improving both an end of line and end of line cooling solution performance. Adjusting a spring rate at displacement of, for example, a wave spring, for each contacting surface allows modulation of a specific load (pressure) applied to each secondary device being cooled.

Figure 5:
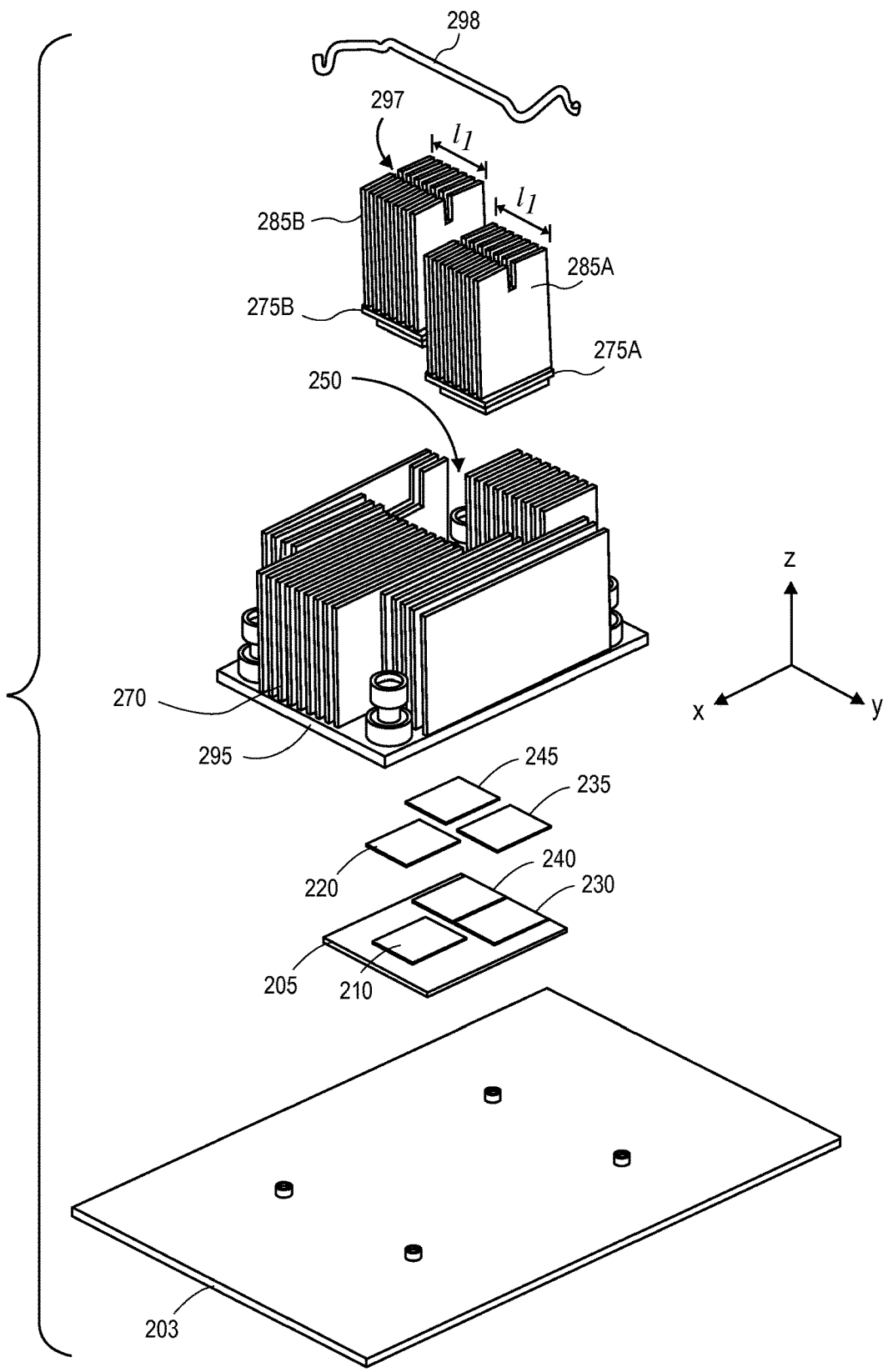
FIG. 5 shows a schematic exploded top side view of a second embodiment of an assembly including a cooling solution on a multi-chip package.
Figure 6:
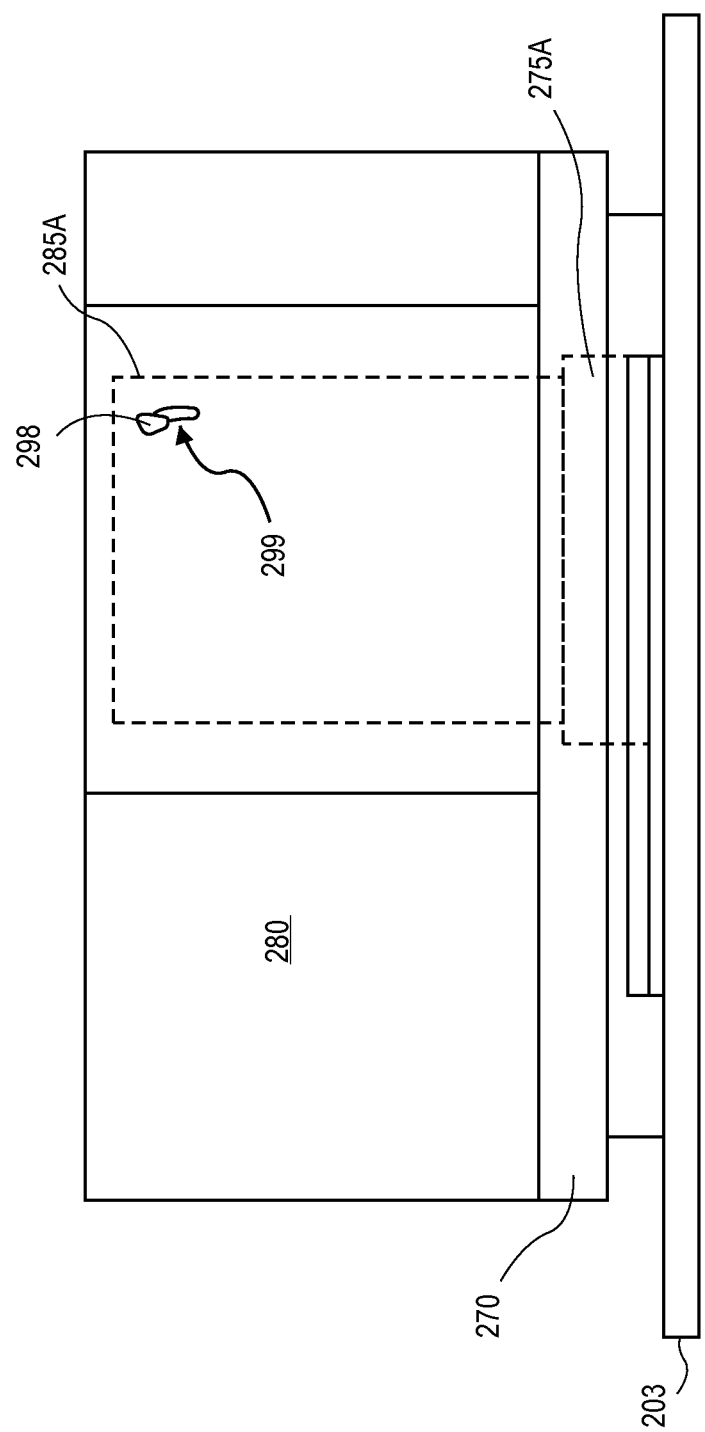
FIG. 6 shows a side view of the assembled structure of FIG. 5.

FIG. 5 and FIG. 6 shows an embodiment of another assembly including a passive heat exchanger (heatsink) coupled to a multi-chip package. Referring to FIG. 5, assembly 200 includes multi-chip package 205 including primary die 210 that is, for example, a CPU and secondary device 230 and secondary device 240 that representatively are a memory chip and a companion chip. Overlying the individual die, in one embodiment, is an IHS separated by TIM1 of minimum required thickness. FIG. 5 also shows optional IHS 220 on primary device 210, IHS 235 on secondary device 230 and IHS 245 on secondary device 240. Disposed on the IHSs, enclosed on the package assembly is a passive heat exchanger that is a heatsink including first heatsink base 270 and first heatsink fins 280. The first heatsink base and the first heatsink fins have dimensions, in one embodiment, that extend over at least a majority area of the multi-chip package on a majority of a heat producing area of the package. Disposed within the body of first heatsink base 270 and first heatsink fins 280 are one or more openings to accommodate secondary heat exchanger systems. FIG. 5 shows second heat exchange portions as heatsinks including second heatsink fin 285A on second heatsink base 275A and second heatsink fin 285B on second heatsink base 275B. Each of the second heat exchange portions has dimensions to fit within the openings in the first heatsink fins and base. In one embodiment, first heatsink base 270 is justified to first device 210 (CPU die) (e.g., justified to contact with IHS 270 or a TIM2 material on IHS 220). In one embodiment, a TIM2 material on IHS 220 has minimum effective thickness. First heatsink base 270 is fixed to baseboard 203 with spring loaded screws 295.

As in the prior embodiment described with reference to FIGS. 1-4, the second heat exchange devices (heatsinks) float or are free to move in a z-direction with respect to the first passive heat exchanger. Once the first passive heat exchange device is installed on the CPU package and justified to primary device 210, the second passive heat exchange devices (heatsinks) are inserted into the opening(s) in the first heat exchange device. In another embodiment, the second passive heat exchange devices (heatsinks) are pre-assembled in the first heat exchange device (heatsink) and the combined assembly is installed on the CPU package at the same time. Because the second passive heat exchange devices are unrestricted in such opening(s), the devices can advance to a point of contact with an underlying secondary device (e.g., die 230 and die 240, respectively, or an IHS on such device (IHS 235 and IHS 245, respectively)) or a thermal interface material (TIM2) on such die. Thus, a TIM2 of minimum effective thickness may be disposed on a surface of the secondary die. To maintain the second passive heat exchange devices (second heatsink base 275/second heatsink fin 285A and second heatsink base 275/second heatsink fin 285B), a retention spring is disposed across the heatsink fin structure of each secondary device. FIG. 5 shows retention spring 298 that is disposed in groove 297 formed across the top of the fin of each second device. As shown in FIG. 6, retention spring 298 is connected at or near one end through an opening formed in a fin of primary heatsink fin 280 and a second end is connected at or near a second end in a second fin of primary heatsink fin 280 on opposite sides of the secondary devices (heatsink fins of the secondary structure) so that retention spring 298 is disposed in groove 297 across a y-direction length, $l_1$, of each second fin and contacts and applies a predetermined z-direction force on the second fin and toward the package. FIG. 6 shows a side view of the assembled structure and illustrates retention spring 298 protruding through opening 299 in a fin of first heatsink fin 280.

In the above embodiment, the secondary devices (secondary dies or chips) are laterally aligned in a y-direction so that the second passive heat exchangers can similarly laterally align and a single retention spring (retention spring 298) may be used to apply a selected downward force on such second passive exchange structures to maintain a predetermined mechanical load on the second passive heat exchange structures. In another embodiment, such secondary devices may not be laterally aligned such that the openings in the first passive exchange device are not aligned and corresponding second passive heat exchange structures are not laterally aligned. In such an embodiment, multiple retention springs would be utilized.

EXAMPLES

Example 1 is an apparatus including a primary device and at least one secondary device coupled in a planar array to a substrate; a first passive heat exchanger disposed on the primary device and having an opening over an area corresponding to the at least one secondary device; a second passive heat exchanger disposed on the at least one secondary device; at least one first spring operable to apply a force to the first heat exchanger in a direction of the primary device; and at least one second spring operable to apply a force to the second heat exchanger in the direction of the secondary device.

In Example 2, each of the first heat exchanger and the at least one second heat exchanger in the apparatus of Example 1 includes a heatsink base and a fin structure.

In Example 3, the second spring in the apparatus of Example 2 is disposed between the first sink base and the at least one second heatsink base.

In Example 4, the thickness dimension of the primary device on the substrate in the apparatus of Example 3 is different than a thickness dimension of the at least one secondary device and the second spring is operable to be compressed a distance equivalent to a difference between a thickness difference of the first heatsink base and the at least one second heatsink base.

In Example 5, the first heatsink base comprises a first thickness in an area corresponding to the first device and in an area adjacent the opening in the apparatus of Example 2 includes a second thickness that is less than the first thickness.

In Example 6, the at least one second spring in the apparatus of Example 2 is disposed across a dimension of the fin structure of the at least one second heat exchanger.

In Example 7, the thickness dimension of the primary device on the substrate in the apparatus of Example 6 is different than a thickness dimension of the at least one secondary device and the second spring is operable to displace the second heatsink toward the at least one secondary device.

In Example 8, the thickness dimension of the primary device on the substrate in the apparatus of Example 7 is greater than a height dimension of the at least one secondary device.

In Example 9, the heatsink base of the first heat exchanger in the apparatus of Example 2 has a thickness selected to justify the heatsink base with the primary device.

Example 10 is an apparatus including a passive heat exchanger having dimensions operable for disposition on a multi-chip package, the passive heat exchanger including a first portion having a first area with an opening therein; a second portion having dimension operable for disposal in the opening; and a spring operable to apply a force to the second portion.

In Example 11, each of the first portion and the second portion of the heat exchanger in the apparatus of Example 10 includes a heatsink base and a fin structure.

In Example 12, the spring in the apparatus of Example 11 is disposed between the first sink base and the at least one second heatsink base.

In Example 13, the thickness dimension of the first heatsink base in the apparatus of Example 12 is different than a thickness dimension of the at least one second heatsink base.

In Example 14, the thickness dimension of the at least one second heatsink base in the apparatus of Example 13 is less than the thickness dimension of the first heatsink base.

In Example 15, the at least one spring in the apparatus of Example 11 is disposed across a dimension of the fin structure of the at least one second portion.

In Example 16, the heatsink base of the first portion in the apparatus of Example 11 has a thickness operable to justify the heatsink base with a device in a multi-chip package including the greatest heat generation.

Example 17 is a method including placing a passive heat exchanger on a multi-chip package, the passive heat exchanger including a first portion having a first area disposed on a primary device, the first portion having at least one opening over an area corresponding to at least one secondary device; a second portion having dimension operable for disposal in the at least one opening; and deflecting a spring to apply a force to the second portion of the passive heat exchanger in a direction of the at least one secondary device.

In Example 18, each of the first portion and the second portion of the heat exchanger of the method of Example 17 includes a heatsink base and a fin structure and the spring is disposed between the first sink base and the at least one second heatsink base.

In Example 19, each of the first portion and the second portion of the heat exchanger of the method of Example 17 includes a heatsink base and a fin structure and the spring is disposed across a dimension of the fin structure of the second portion of the heat exchanger.

In Example 20, each of the first portion and the second portion of the heat exchanger of the method of Example 17 includes a heatsink base and a fin structure and the heatsink base of the first portion has a thickness operable to justify the heatsink base with the primary device.

In Example 21, a multi-chip package assembly including a heat exchanger is made by any of the methods of Examples 17-20.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

The invention claimed is:

1. An apparatus comprising:
a primary device and at least one secondary device coupled in a planar array to a substrate;
a first passive heat exchanger comprising a heatsink base and a fin structure disposed on the primary device and the heatsink base and the fin structure of the first passive heat exchanger both comprise an opening over an area corresponding to the at least one secondary device, wherein the heatsink base of the first passive heat exchanger has a bottommost surface;
at least one second passive heat exchanger comprising a heatsink base and a fin structure both disposed in the opening and on the at least one secondary device;
at least one first spring operable to apply a force to the first passive heat exchanger in a direction of the primary device, the at least one first spring between the substrate and the heatsink base of the first passive heat exchanger; and
at least one second spring operable to apply a force to the at least one second passive heat exchanger in a direction of the at least one secondary device, the at least one second spring between the heatsink base of the first passive heat exchanger and the heatsink base of the at least one second passive heat exchanger, wherein the at least one second spring extends below the bottommost surface of the heatsink base of the first passive heat exchanger.

2. The apparatus of claim 1, wherein a thickness dimension of the primary device on the substrate is different than a thickness dimension of the at least one secondary device.

3. The apparatus of claim 1, wherein the heatsink base of the first passive heat exchanger comprises a first thickness in an area corresponding to the primary device and in an area adjacent the opening comprises a second thickness that is less than the first thickness.

4. The apparatus of claim 1, wherein the at least one second spring is disposed across a dimension of the fin structure of the at least one second passive heat exchanger.

5. The apparatus of claim 4, wherein a thickness dimension of the primary device on the substrate is different than a thickness dimension of the at least one secondary device and the at least one second spring is operable to displace the heatsink of the at least one second passive heat exchanger toward the at least one secondary device.

6. The apparatus of claim 5, wherein the thickness dimension of the primary device on the substrate is greater than the thickness dimension of the at least one secondary device.

7. The apparatus of claim 1, wherein the heatsink base of the first passive heat exchanger has a thickness selected to justify the heatsink base of the first passive heat exchanger with the primary device.

8. The apparatus of claim 1, wherein the at least one second spring is a coil spring or a wave spring to maintain a mechanical load of the heatsink base of the at least one second passive heat exchanger.

* * * * *